United States Patent
Matsumoto et al.

(10) Patent No.: US 10,256,285 B2
(45) Date of Patent: Apr. 9, 2019

(54) ORGANIC ELECTROLUMINESCENCE DISPLAY DEVICE WITH IMPROVED BRIGHTNESS EVENNESS AND MANUFACTURING METHOD THEREOF

(71) Applicant: Japan Display Inc., Minato-ku (JP)

(72) Inventors: Yuko Matsumoto, Minato-ku (JP); Toshihiro Sato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/275,819

(22) Filed: Sep. 26, 2016

(65) Prior Publication Data
US 2017/0141180 A1 May 18, 2017

(30) Foreign Application Priority Data
Nov. 12, 2015 (JP) ................................. 2015-222358

(51) Int. Cl.
*H01L 27/32* (2006.01)
*H01L 51/52* (2006.01)

(52) U.S. Cl.
CPC ...... *H01L 27/3279* (2013.01); *H01L 27/3246* (2013.01); *H01L 27/3258* (2013.01); *H01L 27/3297* (2013.01); *H01L 51/5228* (2013.01); *H01L 2227/323* (2013.01)

(58) Field of Classification Search
CPC ........ H01L 27/3276–27/3279; H01L 27/3297; H01L 2227/323
See application file for complete search history.

(56) References Cited

U.S. PATENT DOCUMENTS

| | | | |
|---|---|---|---|
| 2002/0158835 A1* | 10/2002 | Kobayashi | G09G 3/3688 345/100 |
| 2011/0186819 A1 | 8/2011 | Kume et al. | |
| 2011/0204369 A1* | 8/2011 | Ha | H01L 51/5228 257/59 |
| 2016/0126304 A1* | 5/2016 | Cho | H01L 27/3276 257/40 |
| 2017/0125506 A1* | 5/2017 | Kim | H01L 51/5212 |

FOREIGN PATENT DOCUMENTS

| | | |
|---|---|---|
| JP | 2002-124380 | 4/2002 |
| JP | 2004-140003 | 5/2004 |
| JP | 2010-34035 | 2/2010 |

* cited by examiner

*Primary Examiner* — Eduardo A Rodela
(74) *Attorney, Agent, or Firm* — Oblon, McClelland, Maier & Neustadt, L.L.P.

(57) ABSTRACT

A display device includes a display portion that includes a plurality of pixels; common potential supply main wiring that is disposed so as to surround the display portion on an outside of the display portion; a common potential wiring layer that extends to a gap region between the plurality of pixels in the display portion and is electrically connected to the common potential supply main wiring; an organic film that is disposed to cover the plurality of pixels; and a common electrode film that covers the display portion and the common potential supply main wiring, and is disposed to be in contact with the common potential supply main wiring. The common potential wiring layer has a plurality of contact regions in the gap region and the common electrode film is in contact with the plurality of contact regions.

6 Claims, 10 Drawing Sheets

ORGANIC ELECTROLUMINESCENCE DISPLAY DEVICE WITH IMPROVED BRIGHTNESS EVENNESS AND MANUFACTURING METHOD THEREOF

CROSS-REFERENCE TO RELATED APPLICATIONS

The present application claims priority from Japanese application JP 2015-222358, filed on Nov. 12, 2015, the content of which is hereby incorporated by reference into this application.

BACKGROUND OF THE INVENTION

1. Field of the Invention

The present invention relates to a display device and a manufacturing method thereof.

2. Description of the Related Art

A display device has a display portion that performs a screen display, a plurality of pixels are disposed in the display portion, and each pixel includes a display element. Structures of the display elements are different, but, here, a self light emitting element is described as an example. In the self light emitting element, a first electrode, a light emitting layer, and a second electrode are sequentially stacked on a substrate. A voltage is applied (or, a current is injected) between the first electrode and the second electrode. Therefore, the light emitting layer emits light and the screen display is performed. In a case where the second electrode is a common electrode with respect to a plurality of pixels, the second electrode is formed over an entire display portion. In a case where the second electrode is a common electrode, wiring connected to the second electrode is disposed in a frame region that is outside a display region and, in general, the second electrode and the wiring are electrically connected to each other in the frame region.

SUMMARY OF THE INVENTION

The second electrode is formed of, for example, a transparent conductive film. If an electrical conductivity of the second electrode is not sufficient (electrical resistance is high), an influence of a voltage drop generated in the second electrode is increased. In the second electrode, as a distance from a connection portion with respect to the wiring increases, such an influence increases. When the display device performs the screen display, if a potential of the second electrode changes in the display portion, brightness unevenness generated in the screen display is increased. Brightness unevenness is an increasing problem with increase in size of a display screen.

JP 2002-124380A discloses a laser ablation processing method in which an organic light emitting film on the ITO thin film is able to be divided into a plurality of pixels, or contact holes are able to be formed on the organic light emitting film without ITO thin films being removed with each other and a glass substrate being damaged. In addition, a method, in which sharp fine processing is efficiently performed in a metal electrode with little thermal damage to a peripheral portion of a processing edge and an organic electroluminescence (EL) element is finely processed without damaging a transparent electrode, is disclosed in JP 2004-140003A. Furthermore, a manufacturing method of an organic EL display device, which is able to maintain processing uniformity when an electrode layer or an organic compound layer is processed by being partially removed, is disclosed in JP 2010-034035A.

However, in the patent documents described above, a structure to reduce the influence of a voltage drop of the common electrode is not disclosed. The invention is made in view of the problem described above and an object of the invention is to provide a display device, in which an influence of a voltage drop of a common electrode is reduced during driving, and a manufacturing method thereof.

(1) According to an aspect of the present invention, there is provided a display device including a display portion that includes a plurality of pixels; common potential supply main wiring that is disposed so as to surround the display portion on an outside of the display portion; a common potential wiring layer that extends to a gap region between the plurality of pixels in the display portion and is electrically connected to the common potential supply main wiring; an organic film that is disposed to cover the plurality of pixels; and a common electrode film that covers the display portion and the common potential supply main wiring, and is disposed to be in contact with the common potential supply main wiring. The common potential wiring layer has a plurality of contact regions in the gap region and the common electrode film is in contact with the plurality of contact regions.

(2) In the display device according to (1), the plurality of contact regions may be disposed increasingly densely when proceeding from a periphery to a center of the display portion.

(3) In the display device according to (1) or (2), the plurality of contact regions may be disposed so as to compensate for a voltage drop of the common electrode film during driving.

(4) According to another aspect of the present invention, there is provided a manufacturing method of a display device which is a manufacturing method of a display device including a display portion that includes a plurality of pixels and common potential supply main wiring that is disposed so as to surround the display portion on an outside of the display portion, the method including forming a common potential wiring layer that extends to a gap region between the plurality of pixels in the display portion and is electrically connected to the common potential supply main wiring; forming a bank in the gap region; forming a plurality of contact holes that penetrate the common potential wiring layer on the bank; forming an organic film that is disposed to cover the plurality of pixels; removing the organic film that is formed in the plurality of contact holes by laser ablation processing; and forming a common electrode film to cover the display portion and the common potential supply main wiring.

(5) In the manufacturing method of a display device according to (4), in the forming of the plurality of contact holes, the plurality of contact holes may be formed increasingly densely when proceeding from a periphery to a center of the display portion.

DETAILED DESCRIPTION OF THE INVENTION

Figure 1:
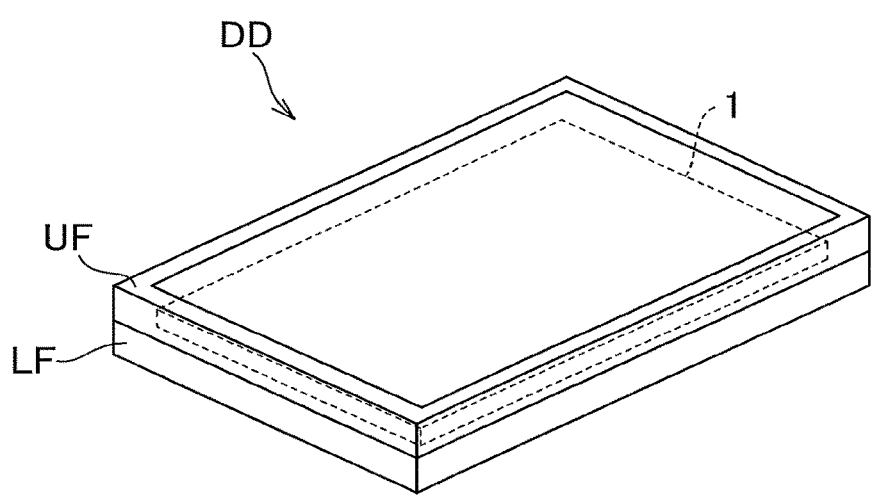
FIG. 1 is a perspective view illustrating an organic EL display device according to a first embodiment of the invention.

Hereinafter, each embodiment of the invention will be described with reference to the drawings. Moreover, the disclosure is merely an example and those which can be easily and appropriately changed by skilled in the art while maintaining the scope of the invention are naturally included in the scope of the invention. In addition, in the drawings, a width, a thickness, a shape, and the like of each portion may be schematically represented compared to an actual embodiment in order to further clarify the description, and those are only an example and do not limit interpretation of the invention. In addition, in the present specification and each drawing, the same reference numerals are given to the same components similar to those previously described with reference to earlier drawings and detailed description thereof will be appropriately omitted.

[First Embodiment]

A display device according to a first embodiment of the invention is an organic EL display device DD and is driven by an active matrix method. FIG. 1 is a perspective view illustrating the organic EL display device DD according to the embodiment. The organic EL display device DD includes an organic EL panel 1 that is fixed so as to be interposed between an upper frame UF and a lower frame LF. Although not particularly illustrated, an outside driving circuit for driving the organic EL panel 1 may be provided on an inside of the upper frame UF and the lower frame LF together with the organic EL panel 1 or may be provided on the outside via lead wiring.

Figure 2:
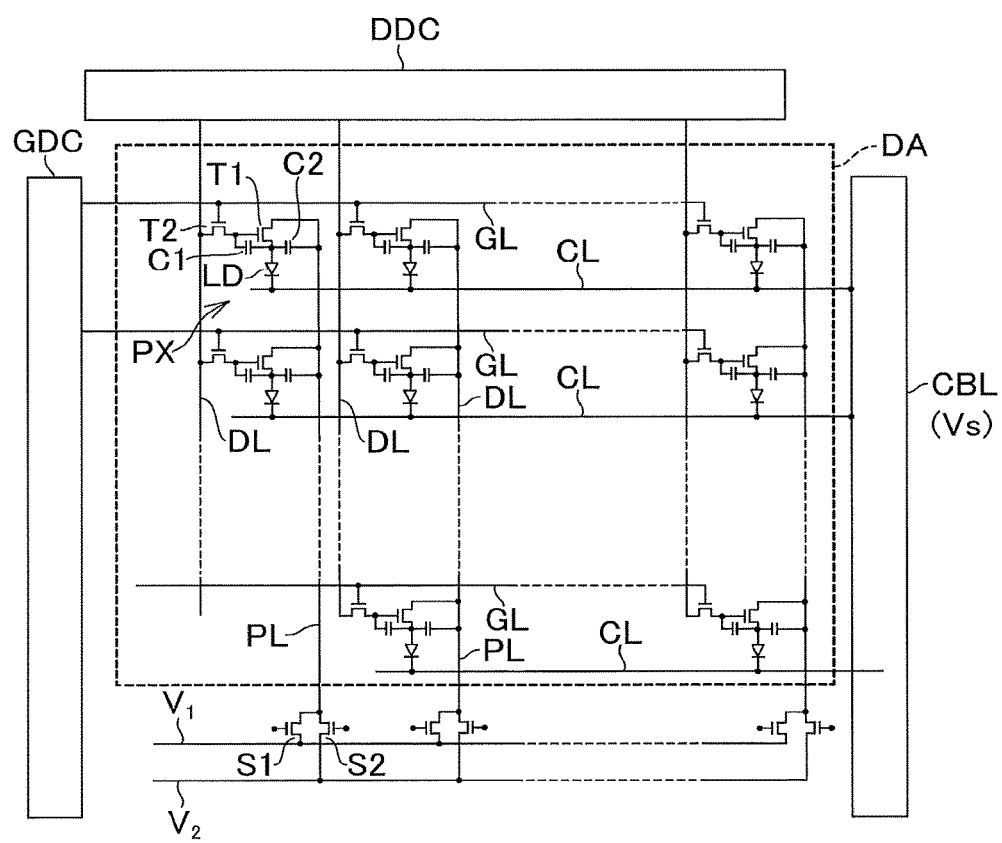
FIG. 2 is an equivalent circuit diagram of an organic EL panel according to the first embodiment of the invention.

FIG. 2 is an equivalent circuit diagram of the organic EL panel 1 according to the first embodiment. The organic EL panel 1 includes a display portion DA (display region) that includes a plurality of pixels PX on a substrate and performs image display. Furthermore, a data drive circuit DDC, a scanning drive circuit GDC, common potential supply main wiring CBL (common bus line), and two potential main wirings $V_1$ and $V_2$, which are respectively disposed in a frame region that is a periphery of the display portion DA, are provided. The display portion DA includes a plurality of gate lines GL which are respectively connected to the scanning drive circuit GDC, a plurality of data lines DL which are respectively connected to the data drive circuit DDC, a plurality of common potential lines CL which are respectively connected to the common potential supply main wiring CBL, and a plurality of potential wirings PL which are respectively connected to the two potential main wirings $V_1$ and $V_2$ via switching elements S1 and S2.

The display portion DA is provided substantially in a center of the substrate. As illustrated in FIG. 2, the data drive circuit DDC is disposed on an upper side of the figure with respect to the display portion DA and outputs an image signal to the plurality of data lines DL extending in a vertical direction in the figure. The scanning drive circuit GDC is disposed on a left side of the figure with respect to the display portion DA and outputs a scanning signal to the plurality of gate lines GL extending in a horizontal direction of the figure. In FIG. 2, the common potential supply main wiring CBL is disposed on a right side of the display portion DA and is connected to the plurality of common potential lines CL extending in the horizontal direction of the figure. The plurality of common potential lines CL are maintained at a reference potential $V_s$ applied to the common potential supply main wiring CBL. Moreover, FIG. 2 illustrates merely an equivalent circuit and configurations of the common potential supply main wiring CBL and the plurality of common potential lines CL are actually different from FIG. 2. This is described later. The data drive circuit DDC and the scanning drive circuit GDC include shift register circuits respectively including a plurality of thin film transistors (hereinafter, referred to as TFT), level shifter circuits, analog switch circuits, and the like.

In the display portion DA, the plurality of pixels PX are disposed in a matrix form at positions where the plurality of gate lines GL and the plurality of data lines DL cross each other. Each pixel PX includes a driver transistor T1, a switch transistor T2, a storage capacitor C1, a pixel capacitor C2, and the light emitting element LD. Both the driver transistor T1 and the switch transistor T2 are the TFTs. In addition, the light emitting element LD is an example of the display element and, here, is an organic light emitting diode (OLED).

As illustrated in FIG. 2, the storage capacitor C1 is connected between a gate electrode and a drain electrode of the driver transistor T1, and potential wiring PL is connected to a source electrode. A gate electrode of the switch transistor T2 is connected to the corresponding gate line GL, one of the source and drain electrodes is connected to corresponding data line DL, and the other is connected to the storage capacitor C1 (and the gate electrode of the driver transistor T1). The pixel capacitor C2 is connected between the drain electrode of the driver transistor T1 and the potential wiring PL. The light emitting element LD is connected between the drain electrode of the driver transistor T1 and the common potential line CL that is maintained at the reference potential $V_s$.

Figure 3:
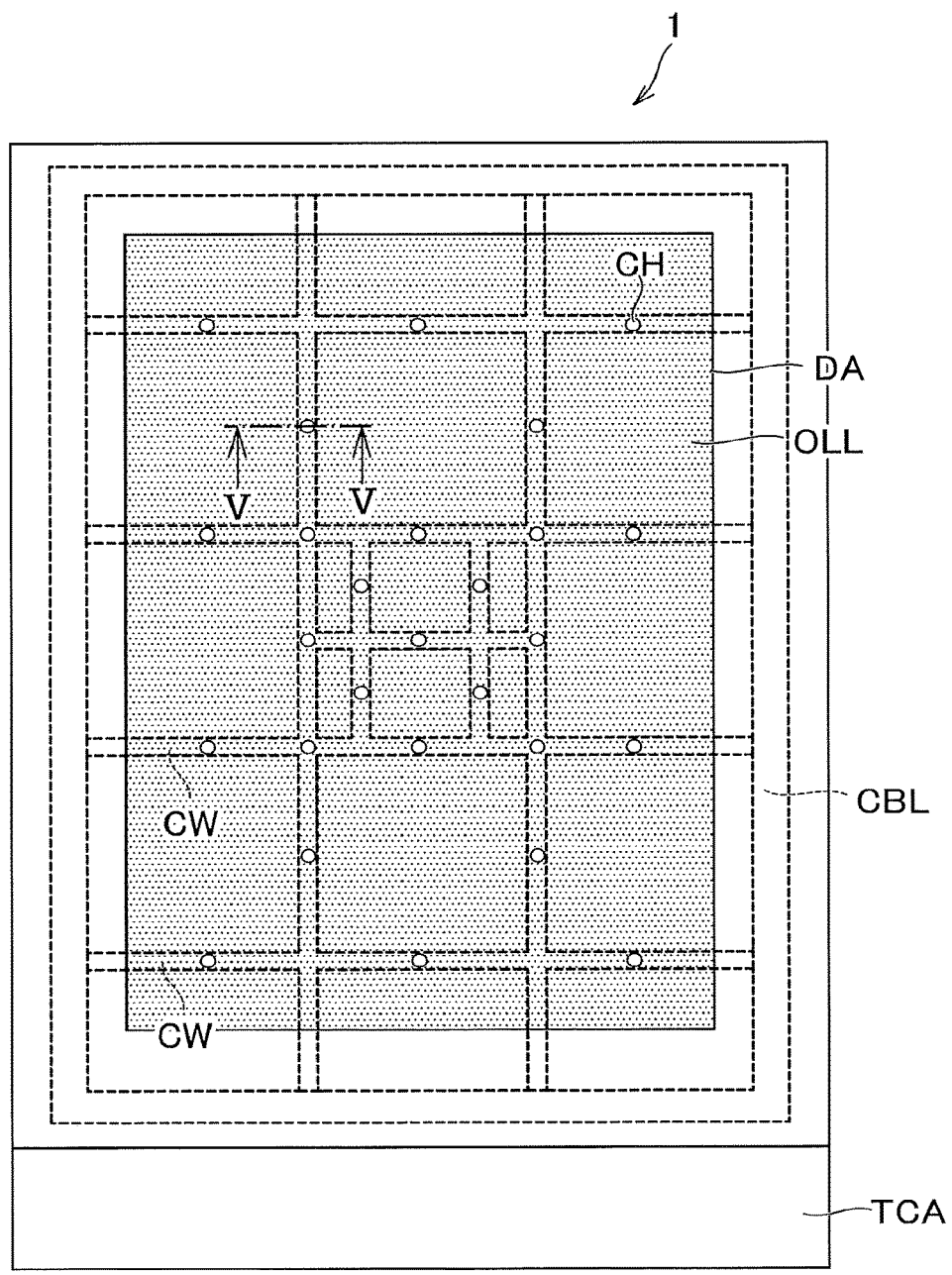
FIG. 3 is a schematic view illustrating a configuration of the organic EL panel according to the first embodiment of the invention.

FIG. 3 is a schematic view illustrating a configuration of the organic EL panel 1 according to the embodiment. In the organic EL panel 1 according to the embodiment, a plurality of contact holes CH are disposed in the display portion DA. The common potential supply main wiring CBL is illustrated on the right side of the display portion DA of FIG. 2, but, actually, the common potential supply main wiring CBL is disposed so as to surround the display portion DA on the outside of the display portion DA. Since a shape of the display portion DA (display region) is rectangular, the common potential supply main wiring CBL is disposed in the frame region of the display portion DA and has a frame shape (rectangular annular shape) surrounding the display portion DA with a predetermined width.

In the organic EL panel 1 according to the embodiment, furthermore, common potential wiring layers (common potential wirings CW) are electrically connected to the common potential supply main wiring CBL, extend in the display portion DA (display region), and have a lattice shape. An entire shape of the common potential wiring layers is the lattice shape, but if the common potential wiring layers are configured of a plurality of common potential wirings CW, common potential wirings CW respectively extend in the vertical direction or the horizontal direction, and are electrically connected to each other. Moreover, both the common potential supply main wiring CBL and the common potential wiring layer are formed of metal, and are formed on the same layer and are integrated using the same step.

An organic light emitting layer OLL is formed on the substrate to cover an entire region of the display portion DA, that is, to cover the plurality of pixels PX. Here, a region in which the organic light emitting layer OLL is disposed is constant with a region of the display portion DA. Then, a region in which the plurality of contact holes CH are formed in regions of the display portion DA is removed from the organic light emitting layer OLL. The region in which the organic light emitting layer OLL is disposed is illustrated in the figure by hatching.

Furthermore, a common electrode film (not illustrated) is formed to cover an entire region (entire region of the display portion DA) of the organic light emitting layer OLL. The common electrode film is a transparent conductive film. The region in which the common electrode film is disposed spreads on the further outside including the display portion DA (display region) and also includes a region in which the common potential supply main wiring CBL is formed. That is, the common electrode film is disposed to cover the display portion DA and the common potential supply main wiring CBL. The plurality of contact holes (not illustrated) are disposed on the common potential supply main wiring CBL. The common electrode film is disposed to be in physical contact with the common potential supply main wiring CBL via the plurality of contact holes, and is electrically connected to the common potential supply main wiring CBL. The electrical contact between the common electrode film and the common potential supply main wiring CBL is mainly established by the physical contact with the plurality of contact holes. Moreover, as illustrated in FIG. 3, a terminal connection portion TCA is provided on a lower side of the display portion DA and a plurality of terminals for connecting to outside wiring of the organic EL panel 1 are disposed in a periphery of a lower end of the figure, but the common electrode film (and the organic light emitting layer OLL) is not formed in such a region.

As illustrated in the figure, the plurality of contact holes CH are disposed on the common potential wiring CW and the organic light emitting layer OLL is not formed in such a region. That is, the common electrode film and the plurality of common potential wirings CW are in physical contact with each other and are electrically connected to each other via the plurality of contact holes CH. That is, regions, in which the contact holes CH are formed in the common potential wiring CW, are the plurality of contact regions which are in contact with the common electrode film. The plurality of contact holes CH (contact regions) are disposed increasingly densely when proceeding from the periphery to the center of the display portion DA. Here, the display portion DA is rectangular and the periphery of the display portion DA is oblong (rectangular). Then, the center of the display portion DA is an intersection of diagonal lines of the rectangle.

Electrical connection between the common electrode film and the common potential supply main wiring CBL is further strengthened by the physical contact between the common electrode film and the common potential wiring layer in the plurality of contact holes CH. The plurality of common potential lines CL extending in each pixel PX are illustrated in FIG. 2, but, actually, the common electrode film also serves as the plurality of common potential lines CL and the electrode of the light emitting element LD of each pixel PX. Furthermore, the common potential wiring CW auxiliary serves a roll (a part of) of the plurality of common potential lines CL. In order to ensure the region of the plurality of pixels PX in the display portion DA, it is preferable that regions of gap regions INT (interval regions) are narrowed as much as possible. If the contact holes CH are formed in such regions, it is necessary to perform fine processing of 10 µm or less. A shape, an area, and the number of the contact holes CH may be arbitrarily set. However, in order to ensure definition, it is preferable that total areas of the contact holes CH (contact regions) which are formed in the display portion DA are 10% or less of the area of the display portion DA.

Figure 4:
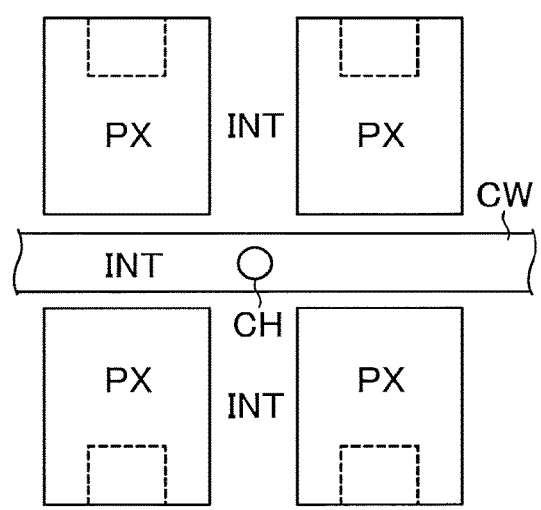
FIG. 4 is a schematic view illustrating the configuration of the organic EL panel according to the first embodiment of the invention.

FIG. 4 is a schematic view illustrating the organic EL panel 1 according to the embodiment. FIG. 4 illustrates an arrangement of the contact hole CH and the pixels PX which are disposed in a periphery thereof. Four pixels PX (=2×2) are arranged in a matrix form in the figure. A region between adjacent pixels PX is the gap region INT. The common potential wiring CW (common potential wiring layer) extends to the gap region INT in a plan view. Since each element is disposed in each pixel PX, it is preferable that the common potential wiring CW is disposed in the gap region INT in the display portion DA. The contact hole CH is formed on the common potential wiring CW in a plan view. In FIG. 4, the contact hole CH is disposed in a position surrounded by four pixels PX, but is not limited to the example, and may be disposed between two adjacent pixels PX.

Figure 5:
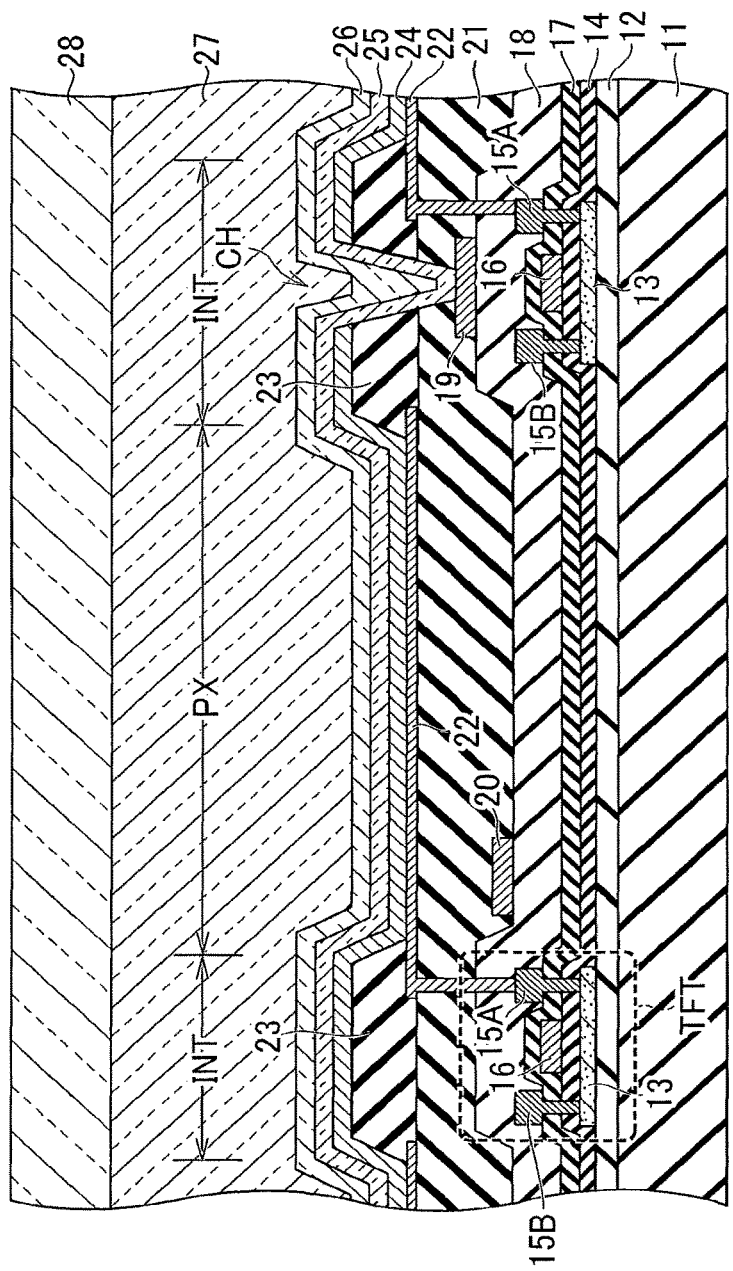
FIG. 5 is a sectional view of the organic EL panel according to the first embodiment of the invention.

FIG. 5 is a sectional view of the organic EL panel 1 according to the embodiment and is a sectional view that is taken along line V-V of FIG. 3. The organic EL display device DD according to the embodiment is a top emission type organic EL display device and emits light to an observer who is positioned on an upper side of FIG. 5.

An underlayer 12, a polysilicon layer 13 having a predetermined shape, a first interlayer insulating layer 14 (gate insulating layer), a gate line layer 16 having a predetermined shape, and a second interlayer insulating layer 17 are laminated on a substrate 11 in this order. A drain electrode layer 15A and a source electrode layer 15B having a predetermined shape are formed by filling a through-hole formed in the first interlayer insulating layer 14 and the second interlayer insulating layer 17. Furthermore, a third interlayer insulating layer 18 is formed and a common potential wiring layer 19 (common potential wiring CW) and a wiring layer 20 are formed on an upper side of the third interlayer insulating layer 18. A fourth interlayer insulating layer 21 is formed to cover the common potential wiring layer 19 and the wiring layer 20. The common potential wiring layer 19 and the wiring layer 20 are metal layers.

Here, the substrate 11 is a glass substrate, but may be a resin substrate or another substrate. The underlayer 12 is a SiNx film or a SiOx film, but may be a mixed film that is obtained by laminating a plurality of such films. The underlayer 12 is provided to suppress that ions such as Na or K are mixed into the polysilicon layer 13 and the first interlayer insulating layer 14. The predetermined shape of the polysilicon layer 13 includes a channel region, a drain region, and a source region. The drain electrode layer 15A and the source electrode layer 15B are respectively electrically connected to the drain region and the source region of the polysilicon layer 13 via the through-hole. The wiring layer 20 is the data line DL and is also disposed on a wiring layer (not illustrated) that is the potential wiring PL. Moreover, one TFT is configured of the polysilicon layer 13, the gate line layer 16, the drain electrode layer 15A, and the source electrode layer 15B. The TFT illustrated in the figure is the driver transistor T1. The fourth interlayer insulating layer 21 is a flatted layer and an upper surface of the fourth interlayer insulating layer 21 is flatted. Even though not illustrated, each element (switch transistor T2, the storage capacitor C1, and the pixel capacitor C2) configuring the pixel PX illustrated in FIG. 2 is disposed on a lower side of the fourth interlayer insulating layer 21.

A lower electrode film 22 (first electrode) is formed on an upper side of the fourth interlayer insulating layer 21 in an island shape including a region to be the pixel PX. The lower electrode film 22 is electrically connected to the drain electrode layer 15A via the through-hole formed in the third interlayer insulating layer 18 and the fourth interlayer insulating layer 21. A bank 23 is formed so as to surround the region that is the pixel PX in the lower electrode film 22. Here, the region that is the pixel PX is a region in which the light emitting element LD of each pixel emits light reaching the observer. The bank 23 is formed in the gap region INT between the plurality of pixels PX and a region in which the bank 23 is formed may be defined as the gap region INT.

An organic film 24 including the light emitting layer (the organic light emitting layer OLL) and an upper electrode film 25 (second electrode) are laminated in this order to cover the lower electrode film 22 and the bank 23. Here, the organic film 24 is formed over (except regions in which the plurality of contact holes CH are formed) an entire region of the display portion DA. In addition, the upper electrode film 25 is the common electrode film, spreads on an entire region of the display portion DA and on the outside thereof, and is formed to include a region in which the common potential supply main wiring CBL (not illustrated) is formed. As described above, the upper electrode film 25 and the common potential supply main wiring CBL are in physical contact with each other and are electrically connected to each other via the plurality of contact holes (not illustrated). In each pixel PX, an organic light emitting diode element (OLED), which is the light emitting element LD, is configured of the lower electrode film 22 (first electrode), the organic film 24, and the upper electrode film 25 (second electrode). The lower electrode films 22 of adjacent pixels PX are respectively electrically isolated to each other by the lower electrode film 22 and the bank 23 that are formed in an island shape. A region that is the pixel PX may be defined as a region in which the lower electrode film 22 faces the upper electrode film 25 via the organic film 24.

The plurality of contact holes CH are formed in the gap region INT. The contact hole CH is a through-hole penetrating the bank 23 and the fourth interlayer insulating layer 21, and a bottom surface of the contact hole CH reaches the common potential wiring layer 19. In addition, in the region in which the contact hole CH is formed, the organic film 24 is removed by steps described below. That is, the organic film 24 is formed other than the region in which the plurality of contact holes CH are formed in the display portion DA (display region). The upper electrode film 25 is formed over (and including the region of an entire region of the common potential supply main wiring CBL) the display portion DA.

Since the organic film 24 is removed in the contact hole CH, in each of the plurality of contact holes CH, the upper electrode film 25 is formed to being in physical contact with the common potential wiring layer 19 and the upper electrode film 25 is electrically connected to the common potential wiring layer 19 via the contact hole CH. Here, the upper electrode film 25 is a transparent electrode film and, for example, is formed of IZO (indium zinc oxide: registered trademark) film, ITO (indium tin oxide) film, or the like.

Here, the lower electrode film 22 is an anode and the upper electrode film 25 is a cathode, and it may be opposite to each other. The organic film 24 has a multi-layered structure. A hole transport layer, a light emitting layer (organic light emitting layer OLL), and an electron transport layer are laminated between the lower electrode film 22 and the upper electrode film 25 in this order from the lower electrode film 22 (anode) side. In the organic light emitting diode element (OLED), if a voltage is directly applied between the upper electrode film 25 and the lower electrode film 22, holes injected from an anode side reach the light emitting layer via the hole transport layer and electrons injected from a cathode side reach the light emitting layer respectively, and recombination of electron-hole is generated. Therefore, light having a predetermined wavelength is emitted from here. Moreover, the light emitting layer and the electron transport layer of the organic film 24 may be formed using a common material. An anode buffer layer or a hole injection layer may also be disposed between the anode and the hole transport layer. Here, a material or a structure, which emits white light by causing a predetermined voltage to apply and a current to flow through between the anode and the cathode, is employed in the organic film 24. In order to realize the white light emission by the organic light emitting diode element, there are a method of laminating a plurality of light emitting layers having different light emission colors by a structure called as multi-photon, a method of doping dyes having different light emission colors in one light emitting layer, and the like. Even if either method is employed, it is preferable that a method, in which the light emission of the white color of which a light emission efficiency is high and an effective life is long is obtained as the organic light emitting diode element of the light emission of the white color, is used. In addition, the organic film 24 has a plurality of layers such as the light emitting layer, the hole transport layer, and the electron transport layer, but, in some cases, may include a layer of an inorganic material.

A sealing film 26 is formed on the upper side of the upper electrode film 25 including an entire region of the display portion DA. It is preferable that the sealing film 26 has high gas barrier property and is transparent to visible light so as not to cause moisture and the like to enter an inside of the organic light emitting diode element. Therefore, the sealing film 26 may be realized by a dense inorganic film such as silicon nitride or a laminated film formed by an inorganic film and an organic film.

The organic EL panel 1 according to the embodiment further includes a color filter substrate 28. The color filter substrate 28 is made by forming a color filter on a transparent substrate such as a glass substrate or a resin substrate. Then, a portion between the sealing film 26 and the color filter substrate 28 is filled with a transparent filling material 27. The filling material 27 may be a polymeric material and, in this case, solid sealing is performed by sealing the filling material 27. In addition, the filling material 27 may be inert gas such as nitrogen gas and may be sealed after peripheral portions of the substrate 11 and the color filter substrate 28 are sealed by a sealing material and the filling material 27 is enclosed in an inner space.

Above, the structure of the display portion DA of the organic EL panel according to the embodiment is described. Hereinafter, a main manufacturing method of the organic EL panel according to the embodiment will be described.

Figure 6:
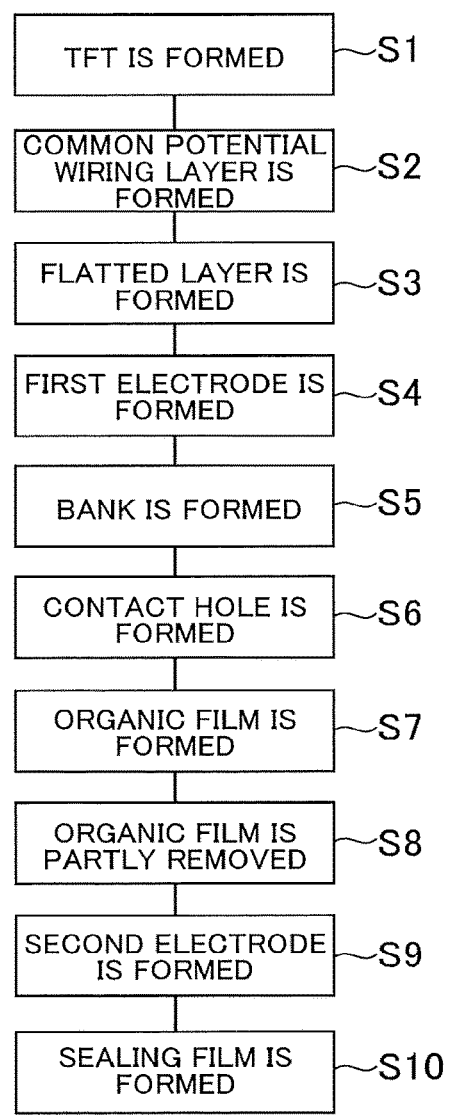
FIG. 6 is a diagram illustrating main manufacturing steps of the organic EL panel according to the first embodiment of the invention.
Figure 7:
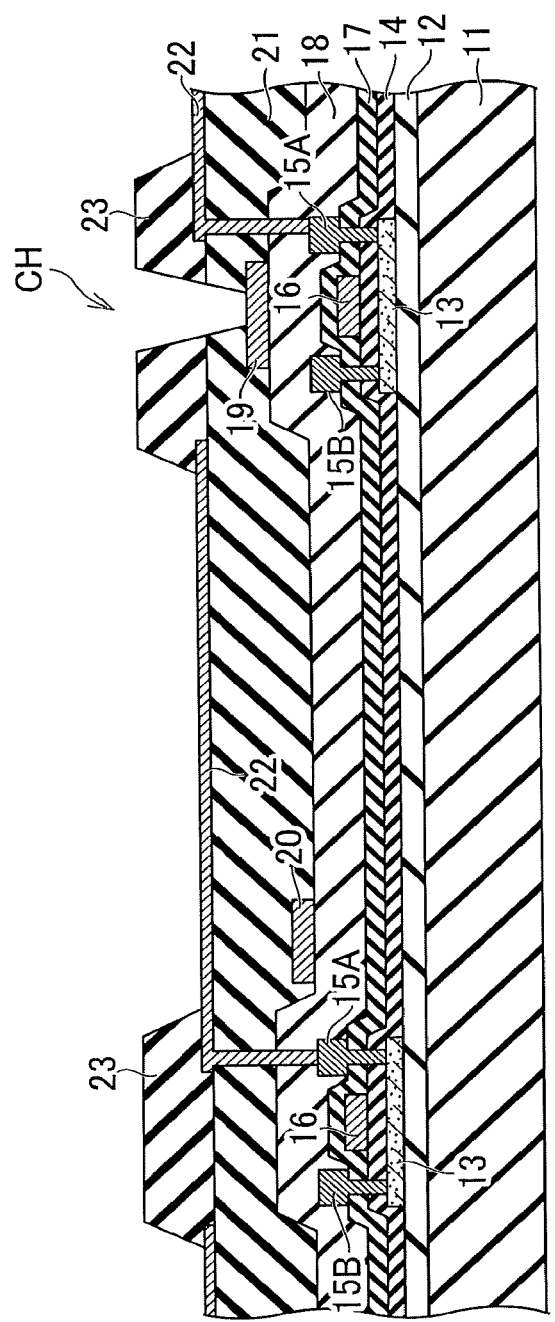
FIG. 7 is a schematic sectional view describing a middle of manufacturing steps of the organic EL panel according to the first embodiment of the invention.
Figure 8:
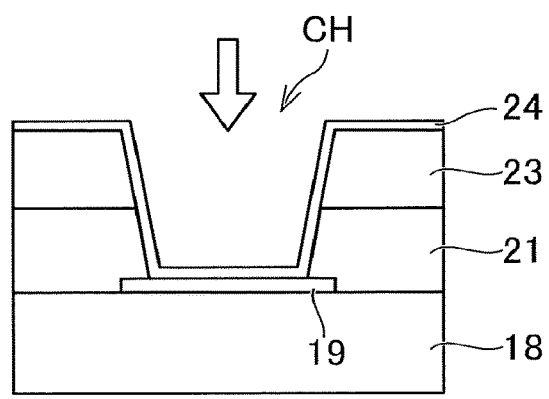
FIG. 8 is a schematic sectional view describing a middle of manufacturing steps of the organic EL panel according to the first embodiment of the invention.
Figure 9:
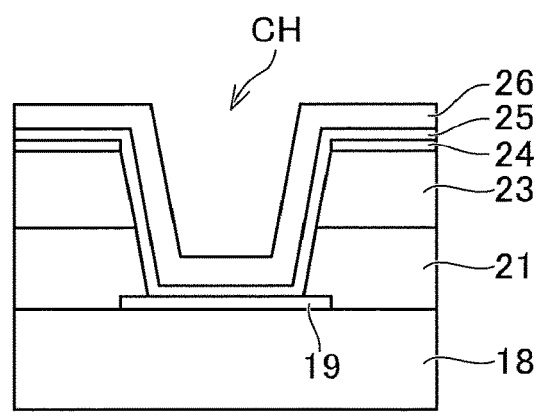
FIG. 9 is a schematic sectional view describing a middle of manufacturing steps of the organic EL panel according to the first embodiment of the invention.

FIG. 6 is a diagram illustrating main manufacturing steps of the organic EL panel 1 according to the embodiment. FIGS. 7 to 9 are schematic sectional views describing a middle of the manufacturing steps of the organic EL panel 1 according to the embodiment.

The TFT is formed on the substrate 11 (S1: a TFT forming step). In such a step, the underlayer 12, the polysilicon layer 13, the first interlayer insulating layer 14, the gate line layer 16, the second interlayer insulating layer 17, the drain electrode layer 15A, the source electrode layer 15B, and the third interlayer insulating layer 18 are formed on the substrate 11 using a known technique.

The common potential wiring layer 19 extending in the gap region INT and electrically connected to the common potential supply main wiring CBL is formed on the third interlayer insulating layer 18 (S2: a common potential wiring layer forming step). In such a step, the wiring layer 20 is also formed.

The fourth interlayer insulating layer 21 (flatted layer) is formed to cover the common potential wiring layer 19 (and the wiring layer 20) (S3: a flatted layer forming step). Furthermore, the lower electrode film 22 is formed on the fourth interlayer insulating layer 21 in a predetermined shape (S4: a first electrode forming step). In this case, a part of the third interlayer insulating layer 18 and the fourth interlayer insulating layer 21 is removed, the through-hole penetrating the drain electrode layer 15A is formed, and then the lower electrode film 22 is formed to fill the through-hole.

The bank 23 is formed in the gap region INT (S5: a bank forming step). Furthermore, the plurality of contact holes CH penetrating the common potential wiring layer 19 are formed on the bank 23 (S6: a contact hole forming step). The contact hole CH is formed using a known photolithography technique. FIG. 7 illustrates a state after such a step.

The organic film 24 which is disposed to cover the plurality of pixels PX is formed (S7: an organic film forming step). Here, the organic film 24 is formed by vapor deposition over an entire region of the substrate 11. Here, the organic film 24 is configured of a material emitting white light, the organic film 24 is formed over the entire region of the substrate, and thereby there is no need to be patterned. FIG. 8 illustrates a state of the vicinity of the contact hole CH after such a step. Since the organic film 24 is formed by vapor deposition, a bottom surface of the contact hole CH and an upper surface of the bank 23 are substantially uniformly formed, but the organic film 24 may not be formed on a side surface of the contact hole CH or the side surface thereof may be unstable even if the organic film 24 is formed.

Moreover, in a case where the light emitting element LD is an element that does not emit white light but emits each color of RGB, the light emitting layer is formed for each color by a mask (selective coating). Even in such a case, in order to simplify the step, if the hole transport layer, the electron transport layer, or the like is formed over the entire region of the substrate 11, and such a layer is made to be the organic film (organic common film), it is possible to apply the invention.

The organic film 24 formed in the plurality of contact holes CH (of the bottom surface and the side surface) is removed by laser ablation processing (S8: an organic film partly removing step). As indicated by an arrow in FIG. 8, the organic film 24 formed on the common potential wiring layer 19 is removed by applying laser to the contact hole CH. A wavelength of the applying laser may be appropriately selected from wavelengths at which the organic film 24 absorbs. A portion among the bottom surfaces of the plurality of contact holes CH, in which the organic film 24 is removed, is the contact region. It is preferable that all the organic films 24 formed on the bottom surfaces of the plurality of contact holes CH are removed.

In a case where light absorption efficiency of the organic film 24 is small, in the common potential wiring layer forming step (S2), a light absorption layer may be formed in a region in which the contact hole CH is formed on the upper surface of the common potential wiring layer 19. In the contact hole forming step (S6), the formed contact hole CH is a through-hole penetrating the light absorption layer formed on the upper surface of the common potential wiring layer 19. Then, in the organic film partly removing step (S8), the organic film 24 and the light absorption layer are removed by laser ablation processing. In this case, the wavelength of the applying laser may be selected from the wavelengths at which the light absorption layer (and the organic film 24) absorbs light.

Furthermore, a part of the organic film 24, which is formed in the frame region in the periphery of the display portion DA, is removed by laser ablation processing and the like. Removing of a portion which is formed in the contact hole and a portion which is formed in the frame region may be performed using the same step or may be performed using different steps. In a case of using the laser, removing thereof may be performed with different wavelengths by selecting appropriate wavelengths respectively.

The upper electrode film 25 (common electrode film) is formed to cover the display portion DA and the common potential supply main wiring CBL (S9: a second electrode forming step). Since the upper electrode film 25 is formed over the entire region of the substrate by a sputtering method and the like, and thereby there is no need to be patterned. Since the organic film 24 of the bottom surface of the contact hole CH is removed, the upper electrode film 25 is established to be in physical contact with and be electrically connected to the common potential wiring layer 19 in the contact hole CH.

The sealing film 26 is formed on the upper electrode film 25 (S10: a sealing film forming step). FIG. 9 illustrates a state after such a step. In the subsequent step, the organic EL panel 1 is manufactured using a known step. Moreover, in a case where the sealing film 26, the upper electrode film 25, and the organic film 24 formed in the terminal connection portion TCA of the organic EL panel 1 are removed, since the organic film 24 acts as a release layer, in a completed product of the organic EL panel 1, the organic film 24 is not left in the terminal connection portion TCA.

Above, a main manufacturing method of the organic EL panel 1 according to the embodiment is described. The upper electrode film 25 of the organic EL panel 1 according to the embodiment can be in physical contact with and be electrically connected to the common potential supply main wiring CBL formed in the frame region. In addition, the upper electrode film 25 thereof can be in physical contact with and be electrically connected to the common potential wiring layer 19 connected to the common potential supply main wiring CBL in the plurality of contact holes CH disposed in the display portion DA (display region). Distribution of the voltage drop (variation) of the display portion DA (display region) in a plane of the upper electrode film 25 is suppressed and luminance unevenness thereof can be reduced during driving. Furthermore, the plurality of contact holes CH (contact regions) are disposed increasingly densely when as proceeding from the periphery to the center of the display portion DA. Therefore, the distribution in the plane is further suppressed and the luminance unevenness can be further reduced. Here, the shape of the display portion DA is rectangular, but is not limited to the example. The plurality of contact holes CH (contact region) may be disposed so as to compensate the voltage drop of the upper electrode film 25 (common electrode film) during driving.

Since the mask is not required to form the organic film 24, it is possible to form the organic film 24 in the same step as an organic EL panel of another type in which a panel size or a wiring structure is different. An effect that switching of product types can be easily performed is exhibited.

[Second Embodiment]

Figure 10:
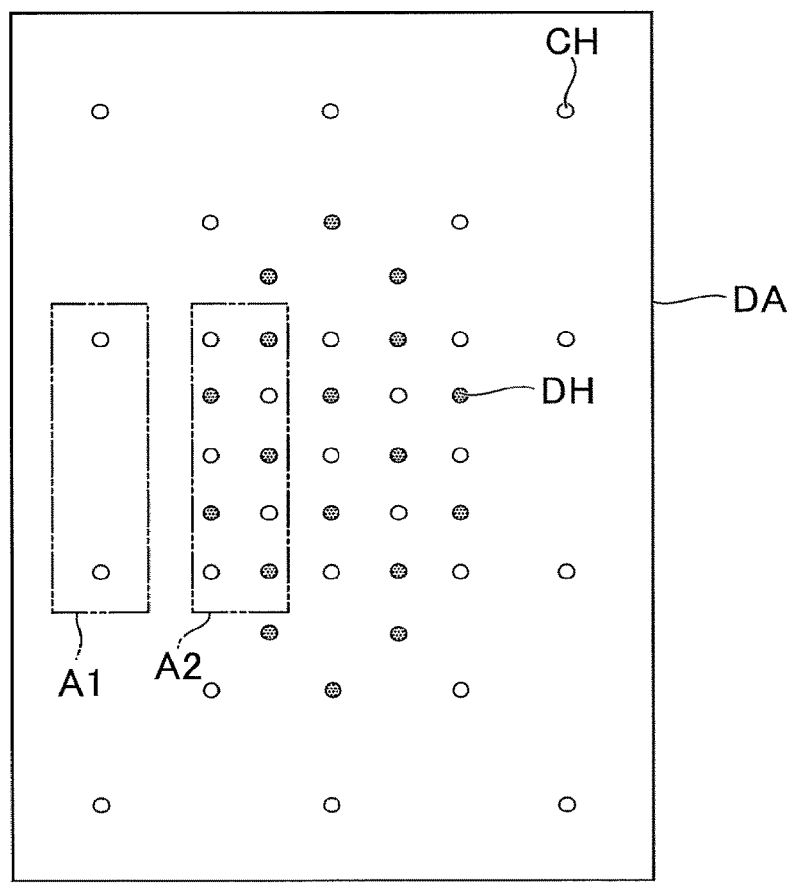
FIG. 10 is a schematic view illustrating a configuration of an organic EL panel according to a second embodiment of the invention.

FIG. 10 is a schematic view illustrating a configuration of an organic EL panel according to a second embodiment of the invention. The organic EL panel according to the embodiment further includes a plurality of dummy holes in addition to the plurality of contact holes CH disposed on the display portion DA, and other than that, the organic EL panel has the same structure as that of the organic EL panel 1 according to the first embodiment.

In the first embodiment, the plurality of contact holes CH are formed on the bank 23 and the organic film 24 formed in the plurality of contact holes CH is removed. That is, the upper electrode film 25 is in physical contact with the common potential wiring layer 19 in the bottom surface of the plurality of contact holes CH. Meanwhile, in the embodiment, similar to the plurality of contact holes CH, a plurality of dummy holes DH are further formed on the bank 23. In the organic film partly removing step (S8), the organic film 24 formed in the plurality of contact holes CH is removed by laser ablation processing. On the other hand, such processing is not performed in the plurality of dummy holes DH and the organic film 24 is left in the plurality of dummy holes DH. In a second electrode forming step (S9), the upper electrode film 25 is formed, but in the plurality of dummy holes DH, the upper electrode film 25 is formed on the organic film 24. Therefore, in the plurality of dummy holes DH, the upper electrode film 25 is not in physical contact with the common potential wiring layer 19 and electrical connection is not established in the portions.

The following effects are exhibited by disposing the plurality of dummy holes DH in addition to the plurality of contact holes CH. A difference between the contact hole CH and the dummy hole DH is whether the organic film 24 is removed by laser ablation processing (S8: the organic film partly removing step). In other words, in the organic film partly removing step (S8), the number of holes from which the organic film 24 is removed can be arbitrary selected. In a resist pattern of common photolithography, it is possible to form the contact hole CH and the dummy hole DH and to select the number and arrangement of holes from which the organic film 24 is removed in accordance with electrical characteristics of the organic EL panel. Therefore, a remarkable effect of cost reduction is exhibited. The common potential wiring layer 19 including the plurality of contact holes CH and the plurality of dummy holes DH is formed. Therefore, in the organic film partly removing step (S8), it is possible to manufacture the organic EL panel in all common step except that the number of holes from which the organic film 24 is removed is arbitrary selected. Particularly, since there is no need to use a precision deposition mask, even if a screen size of the organic EL panel is increased, a weight load is less. Therefore, a device design is facilitated. In addition, it is possible to reduce the cost of mask member and to reduce a mask cleaning step and an aligning step between the mask and the substrate. Therefore, it is possible to realize further cost reduction.

The number and the arrangement of the plurality of contact holes CH may be arranged so as to compensate the voltage drop of the upper electrode film 25 (common element film) during driving. A case, where the common potential supply main wiring CBL of the frame shape is disposed in the periphery of the display portion DA and electrical contact between the upper electrode film 25 and the common potential supply main wiring CBL is established via the sufficient number of the contact holes, may be considered. In this case, the plurality of contact holes CH (contact regions) may be disposed increasingly densely when proceeding from the periphery to the center of the display portion DA. More strictly, the plurality of contact holes CH may be disposed increasingly densely when proceeding from the common potential supply main wiring CBL formed in the periphery of the display portion DA to the center of the display portion DA.

Since the display portion DA is rectangular in a usual case, it may be dense from the periphery to the center of the display portion along the bisector of the rectangle sides. Here, for sparse and dense, in the display portion DA, a case where a total area of the contact region per unit area is small is sparse (region A1 of the figure) and a case where the total area thereof is large is dense (region A2 of the figure). In the contact holes CH, in a case where areas in which the upper electrode film 25 and the common potential wiring layer 19 are in physical contact with each other are equal to each other, sparse can be indicated by the number of the contact holes CH per unit area.

Above, for the display device and the manufacturing method thereof according to the embodiments of the invention, the organic EL display device is described as an example. However, as long as a display device in which the organic film and the common electrode film are formed to cover the plurality of pixels is provided, the display device is not limited to the organic EL display device and the invention can be widely applied to a self-luminous display device. In addition, similarly, as long as a display device in which the organic film and the common electrode film are formed is provided, the invention can also be widely applied to a display device which controls light emitted from a light source.

Those skilled in the art can conceive various modification examples and change examples within the spirit of the invention, and it is understood that such modification examples and change examples belong to the scope of the invention. For example, for each embodiment described above, those, in which those skilled in the art perform addition, deletion or a design change of configuration elements, or perform addition, deletion or a condition change of steps, are included in the scope of the invention as long as the gist of the invention is included.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a display portion including a plurality of pixels, each pixel of the plurality of pixels having a transistor;
a common potential supply main wiring being disposed so as to surround the display portion on an outside of the display portion;
a common potential wiring layer extending to a gap region between the plurality of pixels in the display portion and is electrically connected to the common potential supply main wiring;
a plurality of lower electrode films being disposed to cover the plurality of pixels, respectively;
a plurality of organic films being disposed on the plurality of lower electrode films, respectively; and
a common electrode film covering the display portion and the common potential supply main wiring and being disposed to be in contact with the common potential supply main wiring,
wherein the common potential wiring layer is covered with an insulating layer, a part of the common potential wiring layer being in contact with the insulating layer,
wherein a channel and a gate of the transistor are disposed directly below the common potential wiring layer,
wherein the plurality of lower electrode films are located on the insulating layer so that the common potential wiring layer is located lower than the plurality of lower electrode films,
wherein the common potential wiring layer is disposed between adjacent two out of the plurality of lower electrode films and is prevented from overlapping with the adjacent two, in a plan view, and
wherein the common potential wiring layer has a plurality of contact regions in the gap region, each of the plurality of contact regions being exposed from the insulating layer and the common electrode film is in contact with the plurality of contact regions.

2. The display device according to claim 1, wherein the plurality of contact regions are disposed increasingly densely when proceeding from a periphery to a center of the display portion.

3. The display device according to claim 2, wherein the plurality of contact regions are disposed so as to compensate for a voltage drop of the common electrode film during driving.

4. The display device according to claim 1, wherein the plurality of contact regions are disposed so as to compensate for a voltage drop of the common electrode film during driving.

5. The display device according to claim 1,
wherein the insulating layer has a dummy contact hole on the common potential wiring layer, and
wherein one of the plurality of organic films is disposed in the dummy contact hole to prevent from physical contact between the common electrode film and the common potential wiring layer.

6. The display device according to claim 1, wherein each of the plurality of lower electrode films is electrically connected to the transistor of the corresponding pixel.

* * * * *